United States Patent [19]

Umezawa

[11] Patent Number: 4,945,980
[45] Date of Patent: Aug. 7, 1990

[54] COOLING UNIT

[75] Inventor: Kazuhiko Umezawa, Tokyo, Japan

[73] Assignee: NEC Corporation, Tokyo, Japan

[21] Appl. No.: 403,828

[22] Filed: Sep. 7, 1989

[30] Foreign Application Priority Data

Sep. 9, 1988 [JP] Japan .................................. 63-225843

[51] Int. Cl.$^5$ .............................................. F28F 27/02
[52] U.S. Cl. ..................................... 165/101; 137/599
[58] Field of Search .............. 165/101; 137/599, 599.1

[56] References Cited

U.S. PATENT DOCUMENTS

| | | |
|---|---|---|
| 2,357,706 | 9/1944 | Toepperwein ................... 165/101 X |
| 2,783,418 | 2/1957 | Peter et al. . |
| 2,999,034 | 9/1961 | Heidenhain . |
| 3,205,469 | 9/1965 | Frank et al. . |
| 3,211,969 | 10/1965 | Colaiaco . |
| 3,651,865 | 3/1972 | Feldmanis . |
| 3,777,220 | 12/1973 | Tatusko et al. . |
| 3,827,457 | 8/1974 | Vutz ..................................... 137/599 |
| 3,881,181 | 4/1975 | Khajezadeh . |
| 3,908,188 | 9/1975 | Kawamoto . |
| 3,912,001 | 10/1975 | Missman et al. . |
| 3,993,123 | 11/1976 | Chu et al. . |
| 4,037,270 | 7/1977 | Ahmann et al. . |
| 4,093,971 | 6/1978 | Chu et al. . |
| 4,109,707 | 8/1978 | Wilson et al. . |
| 4,110,549 | 8/1978 | Goetzke et al. . |
| 4,115,836 | 9/1978 | Hutchison et al. . |
| 4,158,875 | 6/1979 | Tajima et al. . |
| 4,196,775 | 4/1980 | Groh . |
| 4,204,246 | 5/1980 | Arii et al. . |
| 4,245,273 | 1/1981 | Feinberg et al. . |
| 4,282,924 | 8/1981 | Faretra . |
| 4,381,032 | 4/1983 | Cutchaw . |
| 4,398,208 | 8/1983 | Murano et al. . |
| 4,439,918 | 4/1984 | Carroll et al. . |
| 4,467,522 | 8/1984 | Marchisi . |
| 4,468,717 | 8/1984 | Mathias et al. . |
| 4,493,010 | 1/1985 | Morrison et al. . |
| 4,498,122 | 2/1985 | Rainal . |
| 4,509,096 | 4/1985 | Baldwin et al. . |

(List continued on next page.)

FOREIGN PATENT DOCUMENTS

| | | |
|---|---|---|
| 55-86130 | 6/1980 | Japan . |
| 56-70655 | 6/1981 | Japan . |
| 57-106062 | 7/1982 | Japan . |
| 59-130450 | 7/1984 | Japan . |
| 60-160150 | 8/1985 | Japan . |
| 60-257156 | 12/1985 | Japan . |
| 61-171157 | 8/1986 | Japan . |
| 61-226946 | 10/1986 | Japan . |
| 61-276242 | 12/1986 | Japan . |
| 63-81959 | 4/1988 | Japan . |
| 63-226049 | 9/1988 | Japan . |
| 63-308943 | 12/1988 | Japan . |
| 572-951 | 9/1977 | U.S.S.R. . |

OTHER PUBLICATIONS

Microelectronics, Scientific American, published 1977 by W. H. Freeman and Company, San Francisco, Cover page, pp. 51, 166.

Assembly Techniques, pp. 404–420, understood to be from the book Integrated Circuit Engineering, publishing date not known.

(List continued on next page.)

Primary Examiner—Robert G. Nilson
Attorney, Agent, or Firm—Burns, Doane, Swecker & Mathis

[57] ABSTRACT

A cooling unit includes a coolant inlet through which a cooling coolant flows into the coding unit, a plurality of devices to be cooled which are connected to the coolant inlet in parallel, a coolant outlet through which the cooling coolant flows out from the cooling unit to the devices, a plurality of flow rate adjusting portions, connected to the coolant outlet in parallel so as to respectively correspond to the devices, for adjusting flow rates for the respective devices, a circulating pump through which the cooling coolant flows to the flow rate adjusting portions, and a heating exchanging section for heat-exchanging the cooling coolant flowing into the cooling unit through the coolant inlet and supplying the heat-exchanged cooling coolant to the circulating pump.

3 Claims, 4 Drawing Sheets

U.S. PATENT DOCUMENTS

| | | |
|---|---|---|
| 4,535,385 | 8/1985 | August et al. |
| 4,536,824 | 8/1985 | Barrett et al. |
| 4,546,410 | 10/1985 | Kaufman |
| 4,574,879 | 3/1986 | DeGree et al. |
| 4,588,023 | 5/1986 | Munekawa |
| 4,602,125 | 7/1986 | West et al. |
| 4,602,678 | 7/1986 | Fick |
| 4,628,990 | 12/1986 | Hagihara et al. |
| 4,641,176 | 2/1987 | Keryhuel et al. |
| 4,644,385 | 2/1987 | Nakanishi et al. |
| 4,666,545 | 5/1987 | DeGree et al. |
| 4,685,211 | 8/1987 | Hagihara |
| 4,686,606 | 8/1987 | Yamada et al. |
| 4,689,659 | 8/1987 | Watanabe |
| 4,712,158 | 12/1987 | Kikuchi et al. |
| 4,721,996 | 1/1988 | Tustaniwskyj et al. |
| 4,724,611 | 2/1988 | Hagihara |
| 4,727,554 | 2/1988 | Watanabe |
| 4,729,424 | 3/1988 | Mizuno et al. |
| 4,744,007 | 5/1988 | Watari et al. |
| 4,748,495 | 5/1988 | Kucharek |
| 4,750,086 | 6/1988 | Mittal |
| 4,768,352 | 9/1988 | Maruyama |
| 4,781,244 | 11/1988 | Kuramitsu et al. |
| 4,783,721 | 11/1988 | Yamamoto et al. |
| 4,791,983 | 12/1988 | Nicol et al. |
| 4,794,981 | 1/1989 | Mizuno |
| 4,884,167 | 11/1989 | Mine |

OTHER PUBLICATIONS

IEEE Transactions on Components, Hybrids and Manufacturing Technology, vol. CHMT-2, No. 3, Sep. 1979, "Bumped Tape Automated Bonding (BTAB) Practical Application Guidelines", Kanz et al., pp. 301–308.

IEEE Transactions on Components, Hybrids, and Manufacturing Tech., vol. CHMT-3, No. 1, Mar. 1980, "IBM Multichip Multilayer Ceramic Modules for LSI Chips—Design for Performance and Density", Clark et al., pp. 89–93.

IBM J. Res. Develop., vol. 26, No. 1, pp. 55–66, (Jan. 1982), "A Conduction-Cooled Module for High-Performance LSI Devices", Oktay et al.

Electronics, "Supercomputers Demand Innovation in Packaging and Cooling", Lyman, pp. 136–144, Sep. 22, 1982.

IBM Technical Disclosure Bulletin, "Counter-Flow Cooling System", Chu, vol. 8, No. 11, Apr. 1966, p. 1692.

IBM Technical Disclosure Bulletin, vol. 18, No. 12, pp. 3982–3983, "Heat-Pipe Cooled Stacked Electronic Wafer Package", Kerjiliah et al., May 1976.

IBM Technical Disclosure Bulletin, vol. 20, No. 4, Sep. 1977, "Method of Effective Cooling of a High Power Silicon Chip", Doo et al., pp. 1436–1437.

IBM Technical Disclosure Bulletin, vol. 20, No. 11A, Apr. 1978, "Three-Dimensional MLC Substrate Integrated Circuit Support Package", Aichelmann et al., pp. 4349 and 4350.

IBM Technical Disclosure Bulletin, vol. 20, No. 11A, Apr. 1978, "Conduction-Cooling Module", Hwang et al., pp. 4334–4335.

IBM Technical Disclosure Bulletin, vol. 21, No. 6, (Nov. 1970), "Compliant Cold Plate Cooling Scheme", Antonetti et al., p. 2431.

IBM Technical Disclosure Bulletin, vol. 21, No. 6, Nov. 1978, "Solid Encapsulated Module", Chu et al., pp. 2435–2436.

Forward and Introduction of IEEE International Conference on Computer Design: VLSI in Computers; ICCD '83 Session: The New IBM 4381, 3 pages, (Nov. 1, 1983).

IEEE International Conference on Computer Design: VLSI in Computers ICCD '83 Session: The New IBM 4381, "New Internal and External Cooling Enhancements for the Air-Cooled IBM 4381 Module", Oktay et al., 4 pages (Nov. 1, 1983).

IEEE International Conference on Computer Design: VLSI in Computers ICCD '83 Session: The New IBM 4381, "Electrical Design and Analysis of the Air-Cooled Module (ACM) in IBM System/4381", Cherensky et al., 6 pages, (Nov. 1, 1983).

IEEE International Conference on Computer Design: VLSI in Computers ICCD '83 Session: The New IBM 4381, "Hermetic Tin/Lead Solder Sealing for the Air-Cooled IBM 4381 Module", Brady et al., 4 pages, (Nov. 1, 1983).

"Module Package", Dion et al., IBM Technical Disclosure Bulletin, vol. 7, No. 7, (1 page), (Dec. 1964).

COOLING UNIT

Background of the Invention

The present invention relates to a cooling unit and, more particularly, to a cooling unit for circulating/supplying a liquid coolant in/to electronic equipment of a large data processing apparatus.

Recently, with an increase in packing density due to advances in packing techniques for high integration of IC elements constituting an electronic equipment, the heat generating density in the electronic equipment is greatly increased. As a result, the cooling capacity of a forced air cooling system using a cooling fan becomes insufficient for such a device. For this reason, a system for cooling an electronic equipment by circulating a liquid coolant having a large heat capacity, such as water, therein has been proposed and put into practical use.

Such a liquid cooling system requires a cooling unit having an arrangement shown in FIG. 1 to circulate and supply a liquid coolant.

Referring to FIG. 1, reference numeral 101 denotes a cooling unit; and 102, electronic equipment. In this case, the cooling unit 101 comprises a heat exchanger 104, an expansion tank 105, a circulating pump 106, and constant flow rate valves 107. The electronic equipment 102 comprises a plurality of units 109 to 111. Note that reference numeral 103 denotes coolant return inlets; and 108, coolant supply outlets.

In the cooling unit having the above-described arrangement, a liquid coolant supplied through the coolant supply outlets 108 circulates in the electronic equipment 102 to cool it. Thereafter, the liquid coolant whose temperature is increased returns to the cooling unit 101 through the coolant return inlets 103 and enters in the heat exchanger 104 to be cooled. As a result, the temperature of the liquid coolant is decreased. The liquid coolant whose temperature is decreased by the heat exchanger 104 is supplied to the expansion tank 105 and is released to the atmospheric pressure. The liquid coolant is then supplied to the electronic equipment 102 again by the circulating pump 106 through the constant flow rate valves 107.

As a cooling method used by the heat exchanger 104, in addition to a method of using a refrigerator employing a freon refrigeration cycle, a method of using water cooled by an external cooling unit and a method of using air cooled by an air conditioner, and the like are available.

With regard to a data processing apparatus, the system arrangements of identical apparatuses are changed in accordance with the performance required by each user. In many cases, therefore, an arithmetic section is divided into a plurality of identical units, and the arithmetic section is extended in units of casings in accordance with a system arrangement.

For this reason, a cooling unit is designed to circulate/supply a liquid coolant through systems of a number required for a maximum scale arrangement. More specifically, as shown in FIG. 1, a coolant path branches at a circulating pump 106 outlet and at a heat exchanger 104 inlet so that a liquid coolant can be circulated/supplied in/to the respective units 109, 110, and 111 through independent systems. The units 109, 110, and 111 have the same heat generation amount, and the constant flow rate valves 107 are respectively provided to the systems so as to keep the flow rates of the systems constant. In addition, the coolant return inlets 103 and coolant supply outlets 108 are respectively constituted by bidirectional couplers. If the coupler of an unused system is detached, a coolant does not flow out.

According to a conventional cooling method, when the electronic equipment 102 is extended with an increase in degree of integration and packing density of IC elements, extension need not be performed by adding casings and can be performed in units smaller than one casing.

If, however, a supply system of a liquid coolant is to be prepared for each extended unit, a plurality of combinations of outlets and inlets of a liquid coolant are required in one casing, and piping in the casing becomes complicated. This interferes with miniaturization of the device.

In addition, since the number of hoses coupling the cooling unit 101 to the electronic equipment 102 is increased, installation requires much labor.

SUMMARY OF THE INVENTION

It is, therefore, a principal object of the present invention to provide a cooling unit which can reduce electronic equipment in size and allows easy extension and construction for extension of a device.

In order to achieve the above object, there is provided a cooling unit which includes a coolant inlet through which a cooling coolant flows into the cooling unit, a plurality of devices to be cooled which are connected to the coolant inlet in parallel, a coolant outlet through which the cooling coolant flows out from the cooling unit to the plurality of devices, a plurality of flow rate adjusting portions, connected to the coolant outlet in parallel so as to respectively correspond to the devices, for adjusting flow rates for the respective devices, a circulating pump through which the cooling coolant flows to the plurality of flow rate adjusting portions and heat exchanging means for heat-exchanging the cooling coolant flowing into the cooling unit through the coolant inlet and supplying the heat-exchanged circulation pump to the coolant inlet.

Detailed Description of the Preferred Embodiment

Figure 1:
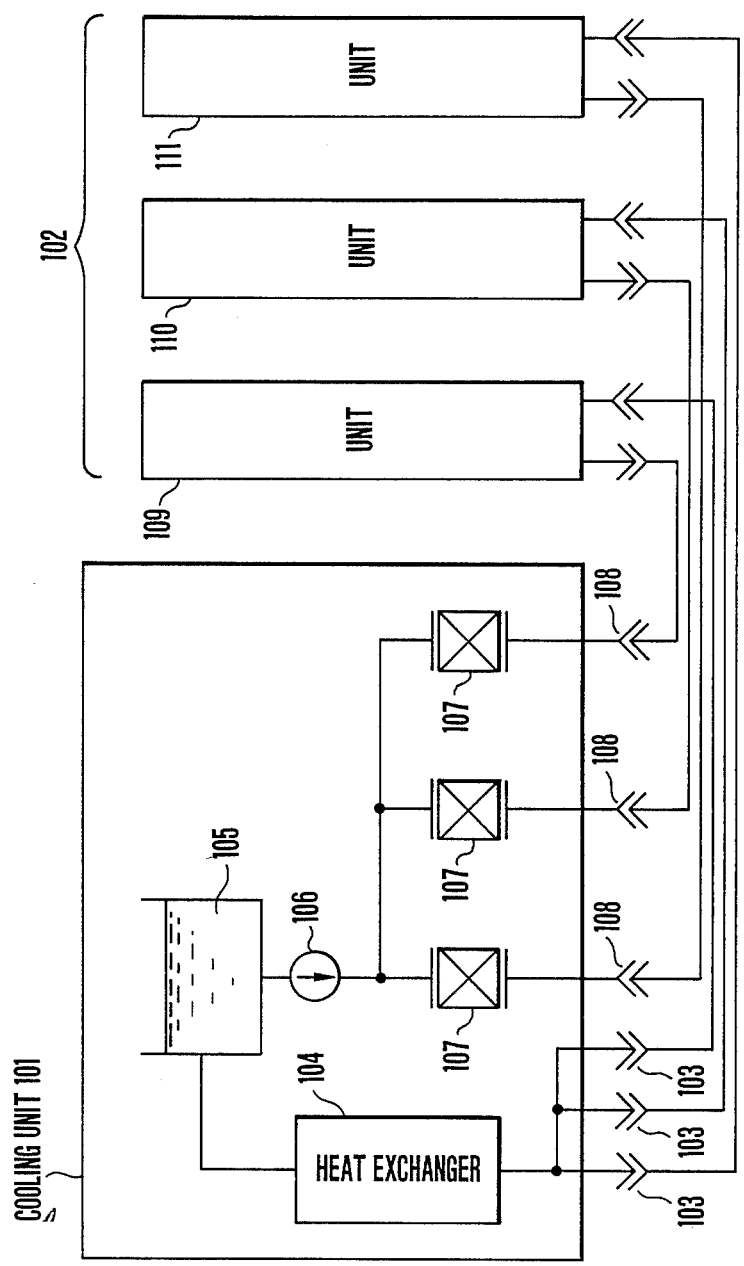
FIG. 1 is a view showing a conventional cooling system.
Figure 2:
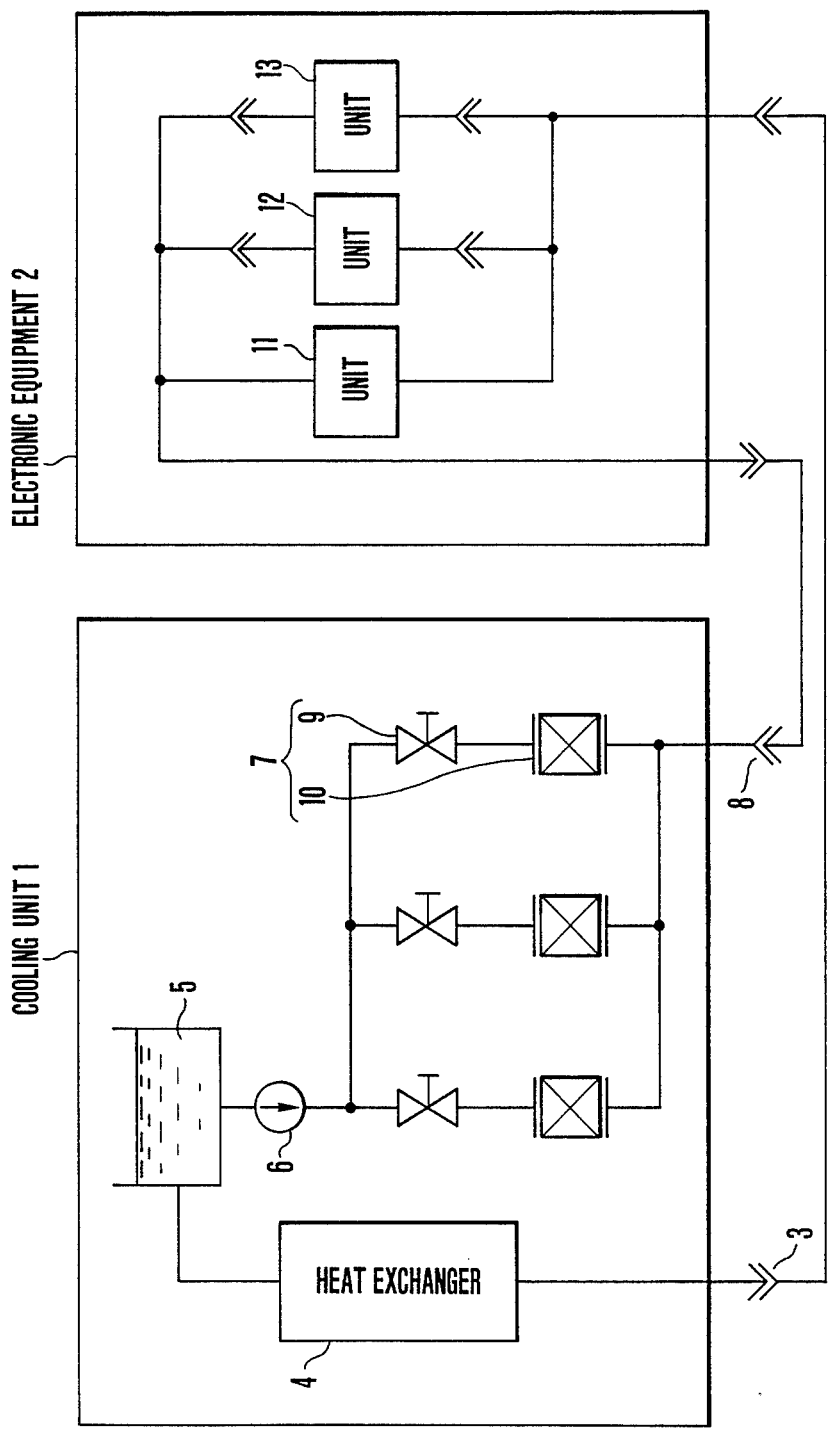
FIG. 2 is a view showing a cooling system of a cooling unit according to an embodiment of the present invention.

FIG. 2 shows a cooling system of a cooling unit according to an embodiment of the present invention. Referring to FIG. 2, reference numeral 1 denotes a cooling unit; 3, a coolant return inlet; 4, a heat exchanger; 5, an expansion tank; 6, a circulating pump; 7, a flow rate adjusting section; and 8, a coolant supply outlet. The flow rate adjusting section 7 comprises solenoid valves 9 and constant flow rate valves 10.

In addition, reference numeral 2 denotes electronic equipment to be cooled upon circulation of a liquid coolant from the cooling unit 1. The electronic equipment 2 is constituted by a unit 11 as a basic unit and units 12 and 13 as extended units, and is housed in one casing.

Assume that the units 11, 12, and 13 have the same heat generation amount.

In the cooling unit having the above-described arrangement, a liquid coolant supplied through the coolant supply outlet 8 circulates in the electronic equipment 2 and absorbs heat generated therein. Thereafter, the liquid coolant whose temperature is increased is flowed in the cooling unit 1 through the coolant return inlet 3, and is cooled by the heat exchanger 4. The liquid coolant is then supplied to the electronic equipment 2 again by the circulating pump 6 through the expansion tank 5, the flow rate adjusting section 7, and the coolant supply outlet 8. Note that as a cooling means for a liquid coolant in the heat exchanger 4, a refrigerator using a freon refrigeration cycle, a method of using water cooled by an external cooling unit, a method of using cooled air supplied from an air conditioner, or the like can be used.

The flow rate adjusting section 7 is designed such that a plurality of systems (three systems in this embodiment) are formed by connecting liquid coolant pipes in parallel at the outlet of the circulating pump 6, and the solenoid valves 9 and the constant flow rate valves 10 are respectively connected to the systems, while the systems converge in front of the coolant supply outlet 8 so as to form one system. Assume that the constant flow rate valves 10 of the respective systems have the same capacity.

Flow rate adjustment of the cooling unit will be described below with reference to FIGS. 3 and 4. When the electronic equipment 2 has a basic arrangement, i.e., only the unit 11, the solenoid valves 9 of two out of the three systems are closed to allow a coolant to flow in the constant flow rate valve 10 of only one system, as shown in FIG. 3.

Figure 3:
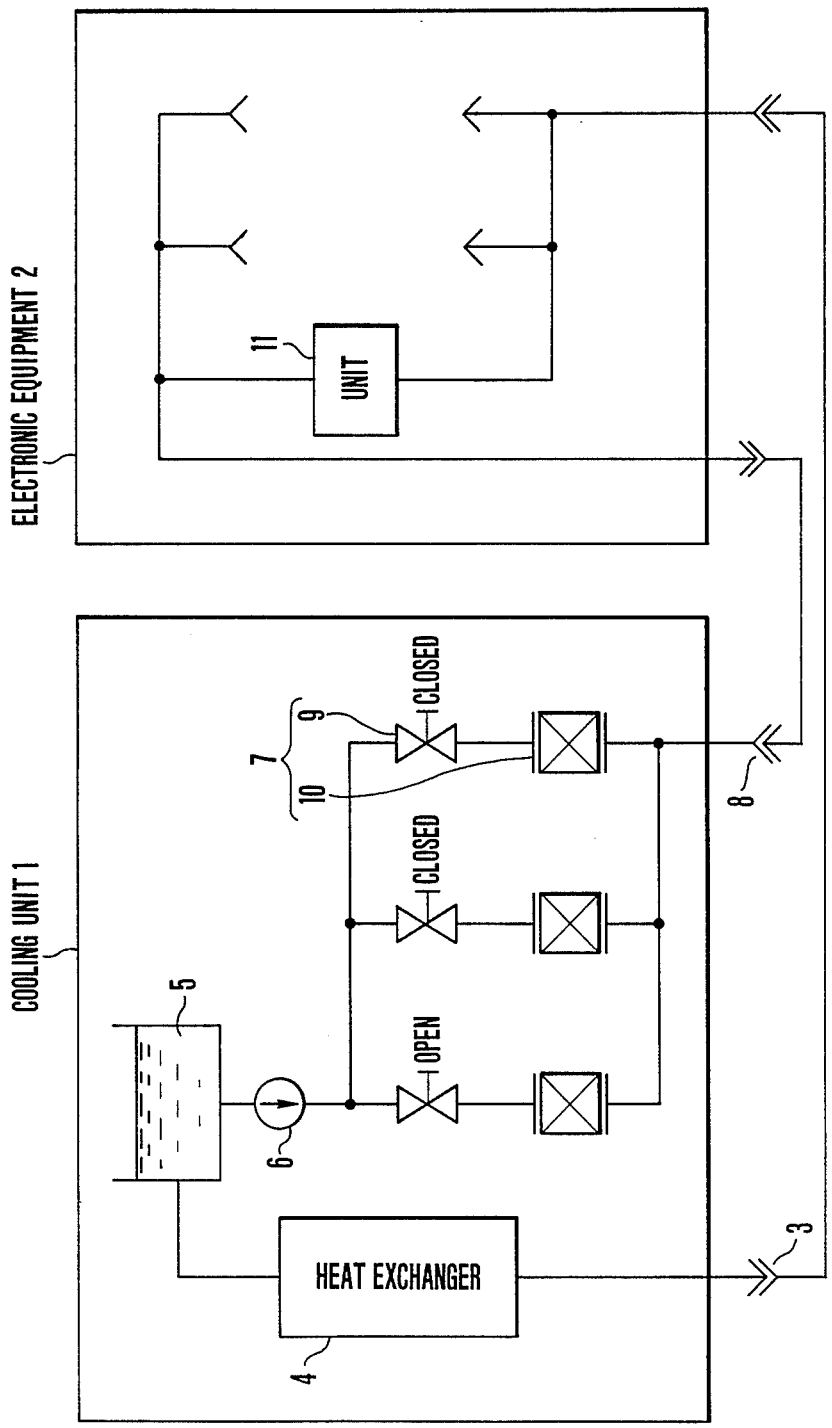
FIGS. 3 and 4 are views showing cases wherein a flow rate adjusting section of the cooling unit of the present invention is used.
Figure 4:
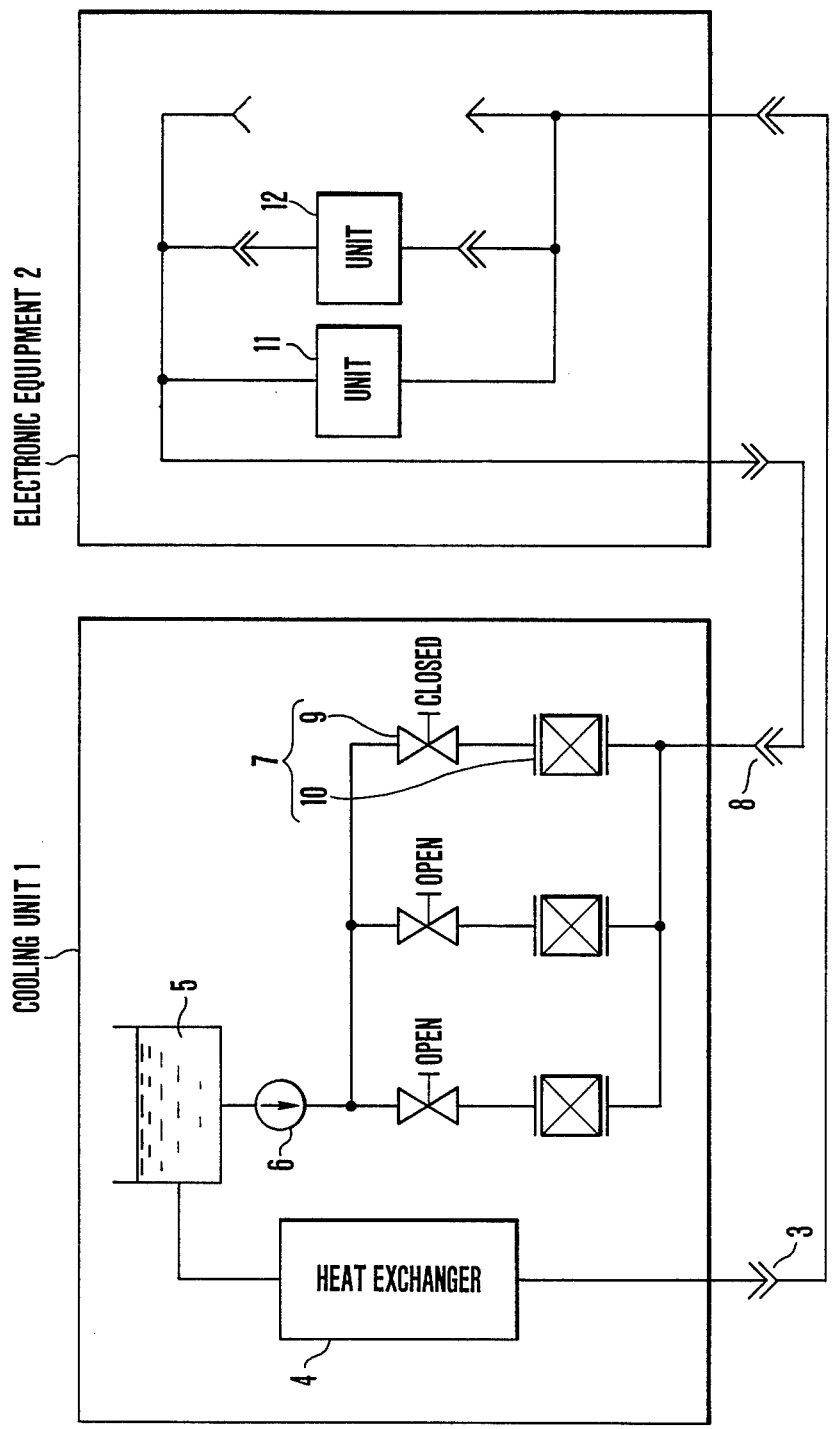

When the unit 12 is added, the solenoid valve 9 of another system of the flow rate adjusting section 7 is opened, as shown in FIG. 4. With this operation, since the coolant flows into the constant flow rate valves 10 of the two systems, it flows at a flow rate twice that of the case shown in FIG. 3.

When the electronic equipment 2 has a maximum scale constituted by the units 11, 12, and 13, as shown in FIG. 2, all the solenoid valves 9 of the flow rate adjusting section 7 are opened so that the coolant can be supplied to the electronic equipment at a flow rate three times that of the case shown in FIG. 3.

As described above, in this embodiment, since the above-described flow rate adjusting section 7 is arranged in the cooling unit 1, a flow rate adjusting operation, e.g., an operation of valves while checking flowmeters, is not required. In addition, since a coolant piping between the electronic equipment and the cooling unit 1 can be formed as one system, even if coolant piping is additionally required for extended units of the device, construction for installation and extension of the device can be easily performed.

Moreover, the coolant outlet and inlet on the electronic equipment side can be formed as one system, and piping in the device can be performed by separating the system into a plurality of systems at only necessary portions. Therefore, the device can be reduced in size.

As has been described above, the cooling unit of the present invention has a function of supplying a liquid coolant at a flow rate corresponding to a change in arrangement of an electronic equipment, so that the electronic equipment can be reduced in size, and construction for installation and extension of the device is facilitated.

What is claimed is:
1. A cooling unit comprising:
   a coolant inlet through which a cooling coolant flows into said cooling unit;
   a plurality of devices to be cooled which are connected to the coolant inlet in parallel;
   a coolant outlet through which the cooling coolant flows out from said cooling unit to said plurality of devices;
   a plurality of flow rate adjusting portions, connected to said coolant outlet in parallel, for selectively adjusting the coolant flow rate flowing through said coolant outlet corresponding to each device to be cooled;
   a circulating pump through which the cooling coolant flows to said plurality of flow rate adjusting portions; and
   heat exchanging means for heat-exchanging the cooling coolant flowing into said cooling unit through said coolant inlet and supplying the heat-exchanged cooling coolant to said circulating pump.

2. A cooling unit according to claim 1, wherein each of said flow rate adjusting portions comprises a solenoid valve and a constant flow rate valve.

3. A cooling unit according to claim 1, wherein said heat exchanging means comprises an expansion tank and a heat exchanger.

* * * * *